United States Patent [19]

Bergemont

[11] Patent Number: 5,012,446
[45] Date of Patent: Apr. 30, 1991

[54] LARGE-SCALE EPROM MEMORY WITH A HIGH COUPLING FACTOR

[75] Inventor: Albert Bergemont, La Tronche, France

[73] Assignee: SGS-Thomson Microelectronics S.A., Gentilly, France

[21] Appl. No.: 392,325

[22] Filed: Aug. 11, 1989

[30] Foreign Application Priority Data

Aug. 11, 1988 [FR] France ............... 88 10963

[51] Int. Cl.$^5$ .............. G11C 11/40; H01L 29/68
[52] U.S. Cl. ................... 365/185; 357/23.5
[58] Field of Search ............ 365/185; 357/23.5, 59 J, 357/59 E, 59 G, 53

[56] References Cited

U.S. PATENT DOCUMENTS

| 4,360,900 | 11/1982 | Bate ........................... 365/184 |
| 4,377,818 | 3/1983 | Kuo et al. ................... 365/185 |
| 4,597,060 | 6/1986 | Mitchell et al. ............ 365/185 |
| 4,812,898 | 3/1989 | Sumihiro ..................... 365/185 |
| 4,855,800 | 8/1989 | Esquivel et al. ............ 365/185 |
| 4,868,619 | 9/1989 | Mukherjee ................. 357/23.5 |
| 4,887,238 | 12/1989 | Bergemont ................. 365/185 |

FOREIGN PATENT DOCUMENTS

0197284 2/1986 European Pat. Off. .
3426306A1 9/1983 Fed. Rep. of Germany .
2296914 12/1974 France .

Primary Examiner—Terrell W. Fears
Assistant Examiner—Michael A. Whitfield
Attorney, Agent, or Firm—Lowe, Price, LeBlanc, Becker & Shur

[57] ABSTRACT

An electrically programmable non-volatile memory comprises an array of word lines (LM2) extending along rows, connecting the control gates of floating gate transistors, and an array of bit lines (LB1, LB2) extending along columns, connecting the drains of the floating gate transistors. A conductive area (35) having a larger size than each floating gate (23) along horizontal direction, is connected to the floating gate (23) of each transistor, and is superposed with the corresponding word line (LM2) from which it is separated by an isolation layer (28).

5 Claims, 11 Drawing Sheets

Figure 1A

PRIOR ART

Figure 1B

PRIOR ART

PRIOR ART

Figure 4

PRIOR ART

PRIOR ART

LARGE-SCALE EPROM MEMORY WITH A HIGH COUPLING FACTOR

BACKGROUND OF THE INVENTION

The invention relates to semiconductor memories and specifically to electrically programmable non-volatile memories, currently called EPROM; in particular, the invention relates to floating gate memories and to a method of manufacturing same.

For obtaining large-scale memories, for example memories able to store up to 16 megabits, the size of each cell of the memory has to be reduced as much as possible.

There are limitations due to physical problems and in particular to the size of photolithographic patterns; another limitation is due to parasitic electrical parameters (associated with the manufacturing process) which disturb the memory operation.

Except for some proposals that have not met industrial success, all the industrial approaches for obtaining large-scale memories correspond to a technology comprising the following main points:

an individual memory point corresponds to a MOS transistor having a floating gate made of a first polysilicon level and a control gate corresponding to a second polysilicon level;

the sources of the transistors are connected to a low potential bus Vss;

a word line for addressing a cell line is made of the second polysilicon level;

a bit line for reading the state of a cell is made of a metal (aluminum) line crossing the word lines and contacting the transistor drains from place to place;

for reducing the size of each memory point, only one contact point is provided for two adjacent drains of two transistors in a same column, this contact ensuring a connection with the bit line; also, only one contact is provided between the sources of two adjacent transistors and the bus at Vss;

the transistors are separated from each other by a thick silicon oxide (thick with respect to the transistor gate oxide), and the bit lines and the word lines pass over this thick oxide;

finally, the writing of this data in a memory cell is made in the following way: the sources of all the transistors of the memory are at a low potential Vss (for example zero volt); the word line connected to the control gate of the cell to be programmed is connected to a programming potential Vpp (for example 15 volts), while all the other word lines are at the low potential Vss; the bit line corresponding to the point to be programmed is set at a high potential Vcc (for example 10 volts), while the bit lines of the points not to be programmed are maintained at the low potential Vss.

With such a memory architecture and the associated programming mode, the drain of a transistor has to be electrically isolated, through a thick oxide, with respect to the drains of the adjacent transistors of the same word line. If such an isolation is not carried out, it is not possible to program a specific memory point without programming or deprogramming the other ones at the same time.

However, the thick oxide which isolates two adjacent points takes a large surface, mainly when it is obtained by a localized oxidation process (locos).

It has been suggested to replace the localized oxidation by oxide-filled grooves for reducing the total size of the cell, but this technology is not easy to implement industrially.

Structures wherein the thick oxide areas and the multiple contacts towards the drains or sources are cancelled have also been suggested. Those structures permit a reduction in the size of the memory array but the addressing system gets more complex and occupies a larger surface.

SUMMARY OF THE INVENTION

For reducing the size of the cells and increasing the storage capacity of the memory, the invention provides a new memory architecture which permits a thick oxide area only on each of two lines of transistors connected to the same word line. Additionally, the suggested architecture avoids the presence of contacts on the bit lines between the cells.

According to the invention, the memory is made of an array of word lines extending along a first direction, called row direction, connecting the control gates of the floating gate transistors, and of bit lines extending along a second direction, called column direction, connecting the drains of the floating gate transistors. A conductive area, having a larger size than that of the transistor floating gate according to a horizontal direction, is connected to the floating gate of each memory transistor, and is superposed with the corresponding word line from which it is separated by an isolation layer.

According to another aspect of the invention, a memory manufacturing process, for a floating gate MOS transistor-type array having rows and columns on a substrate of the first conductivity type, comprises the following steps:

forming thick oxide areas according to columns, depositing and etching a first polysilicon level for forming along columns, on the one hand, two first adjacent stripes between eair pair of thick oxide columns and, on the other hand, two second stripes, each of which extends over the portion included inside this pair and a portion of the corresponding thick oxide layer, implanting a second conductivity type dopant by using the first polysilicon level as a mask, forming an isolation layer between the various areas of the first polysilicon level, depositing a second polysilicon level and isolating its surface, etching the second polysilicon level (35) so it covers columns of the first and second adjacent stripes of the first polysilicon level, laterally isolating the apparent regions of the second polysilicon level, depositing a third polysilicon level, etching with the same mask, according to rows, the three polysilicon levels, forming an isolating level, and establishing contacts with the remaining stripes of the third polysilicon level (word lines), the drain columns (bit lines) and the source columns (constant-potential lines).

BRIEF DESCRIPTION OF THE DRAWINGS

The foregoing and other objects, features and advantages of the invention will be apparent from the following detailed description of preferred embodiments as illustrated in the accompanying drawings wherein.

Generally speaking, as conventional in the field of the integrated circuit representation, it will be noted that the various drawings are not drawn to scale either inside one figure or from one figure to the other, and in particular the thicknesses of the various layers are arbitrarily drawn in order to facilitate the legibility of the drawings.

DETAILED DESCRIPTION OF THE INVENTION

Figure 1A:
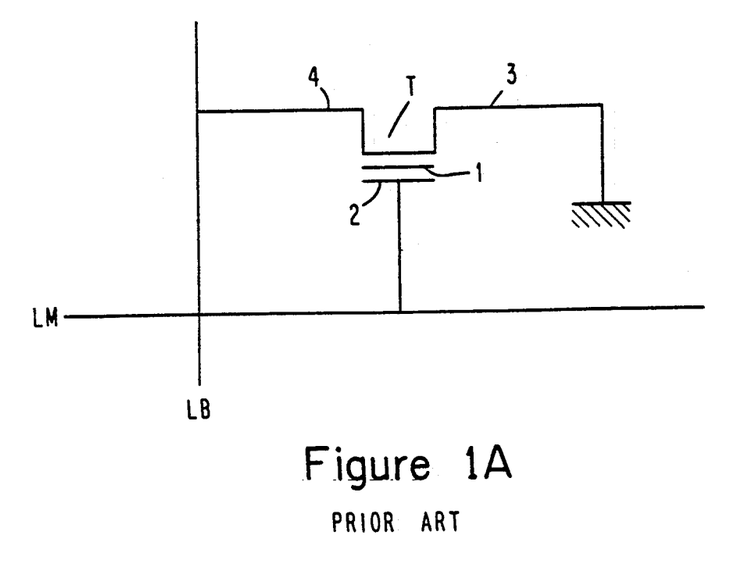
FIGS. 1A and 1B show main circuit and schematic physical diagrams of a conventional elementary memory cell.

In FIG. 1A is shown a transistor T of a floating gate memory point. This transistor comprises a floating gate 1 and a control gate 2, together with two semiconductive regions of a first conductivity type (source 3 and drain 4) separated by a channel region having an opposite conductivity type covered by the floating gate 1 and the control gate 2.

The control gate 2 is connected with a word line LM. The drain 4 is connected with a bit line LB.

For writing such a memory point, the floating gate 1 is charged by injection of hot carriers, by applying to the control gate 2, while a current flows between the source 3 and the drain 4, a sufficiently high potential that causes the charge carriers (electrons) to be trapped in the floating gate. This writing operation causes an increase of the conduction threshold of the transistor which, once written (or programmed), will let current flow only for potential values on its control gate higher than when no programming has been made.

For reading the information contained in a memory point, a voltage higher than the conduction threshold voltage at the non-programmed state and lower than the conduction threshold voltage at the programmed state is applied to the control gate of the transistor of this memory point. If the transistor lets a current flow when a suitable potential difference is applied between the source and the drain, the memory point is at the non-programmed state. If the transistor does not let a current flow, the memory point is at the programmed state.

The voltage applied to the control gate when the memory point is programmed (programming potential Vpp) is for example equal to 15 volts. The drain potential Vcc is then for example 10 volts and the source potential Vss is for example zero volt (or the ground).

The voltage applied to the control gate during the reading of the memory point is for example 5 volts. The drain potential Vcc is then for example 1.5 volts, and the source potential is then for example zero volt or the ground.

Figure 1B:
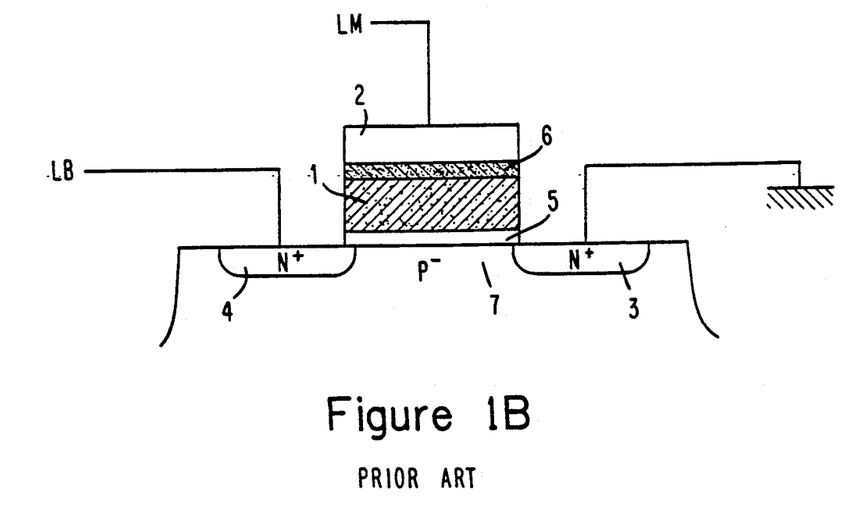

Referring to FIG. 1B, a section view of a memory point designed on a silicon wafer, one can see the floating gate 1 and the control gate 2 of the transistor. The source 3 and the drain 4 are two semiconductive regions of a first conductivity type, for example N+, separated by a channel region 7 of the opposite conductivity type, for example P−.

The floating gate 1 of the transistor is made of a first polysilicon level (poly 1). The floating gate is separated from the substrate by a silicon dioxide layer 5, also called a gate oxide layer.

Above the floating gate 1, is a silicon dioxide layer 6. The layer 6 is arranged between the floating gate 1 and the control gate 2, the latter being made of a second polysilicon level (poly 2). The silicon dioxide layer 6 is also called interpoly oxide layer.

In the memory, the control gate 2 of the transistor is connected to a word line LM. The source 3 is connected to the ground and the drain 4 to a bit line LB.

Figure 2:
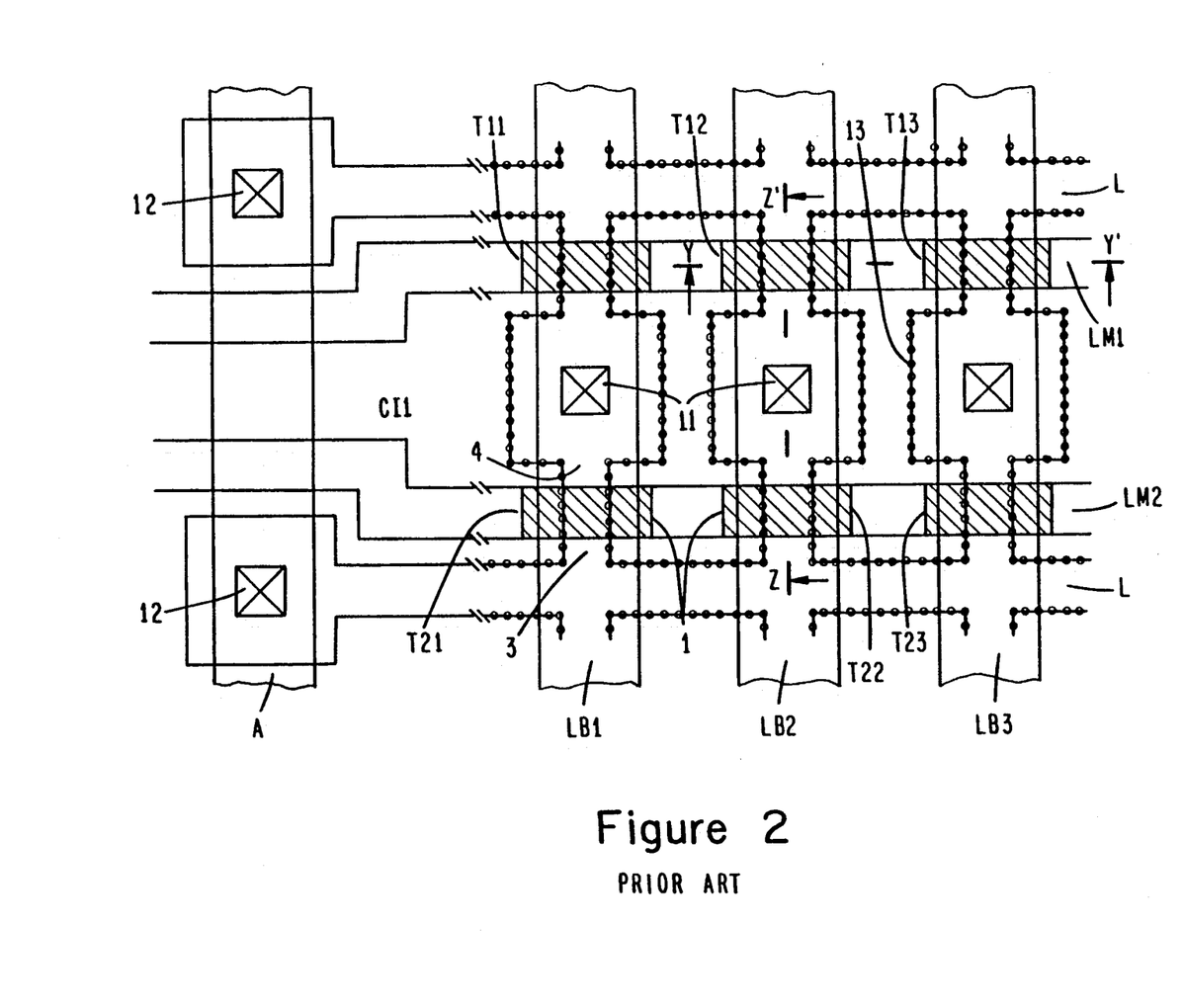
FIG. 2 is a top view of the design of six adjacent memory points on a silicon wafer according to the prior art.

FIG. 2 is a top view of a conventional design of six adjacent memory points on a silicon wafer.

Tij designates a floating gate transistor, i being a row index and j a column index.

The transistors T11-T13 constitute the first row, the transistors T21-T23 constitute the second row.

Transistors T11 and T21 constitute the first column, transistors T12 and T22 the second column and transistors T13 and T23 the third column.

The control gates of the transistors of one row are interconnected with the same word line, LM1 and LM2 for the rows 1 and 2, respectively.

The transistor drains of one column are connected to the same bit line, LB1 to LB3 for the columns 1 to 3, respectively.

The word lines are conductors (in practice polysilicon) extending through a horizontal direction (row direction). The bit lines are conductors extending according to a vertical direction (column direction).

The bit lines pass over the transistors Tij constituting the memory points. They are connected with the drains 4 of the transistors by contacts 11. The floating gates 1 of the transistors are arranged between the drains 4 and the sources 3.

The sources of the transistors of one row are interconnected with a common line L. A pair of transistor rows, separated from an adjacent pair by a contact row 11, shares a single common line L arranged between two rows.

All the common lines L are connected through a contact 12 to a conductive line A which, being at the source potential Vss, permits voltage Vss to be applied to the transistor sources.

An isolation region 13 is arranged between each common line L and each transistor column. In practice, the isolation region is made of a thick silicon oxide.

The floating gate 1 of the transistors projects away from the isolation region.

Figure 3:
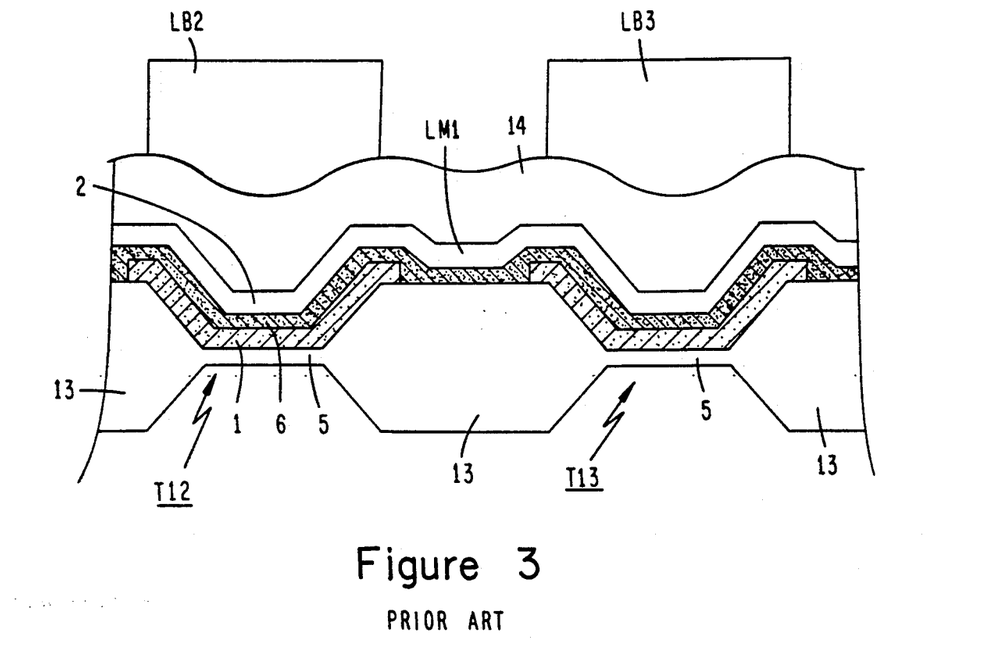
FIG. 3 is a section view according to line YY' of FIG. 2.

Two transistors, for example transistors T12 and T13, are shown on FIG. 3 which is a section view according to line YY' of FIG. 2.

The transistors T12 and T13 are separated by an isolation region 13. Under the floating gate 1 is arranged the gate oxide layer 5. The floating gate 1 has a size according to this section view larger than the gate oxide layer 5 and extends on the isolation regions. One will note the interpoly oxide layer 6 above the floating gate. The word line LM1 extends along a transistor row and constitutes the control gate 2 at the transistor positions.

The word line LM1 is covered with an isolation region 14. This isolation region 14 is for example made of boron and phosphorus doped silicon oxide (BPSG) which flows at a relatively low temperature (about 850° to 950° C.).

The bit lines LB2 and LB3 are arranged over the isolation layer 14, above the transistors T12 and T13, respectively.

Figure 4:
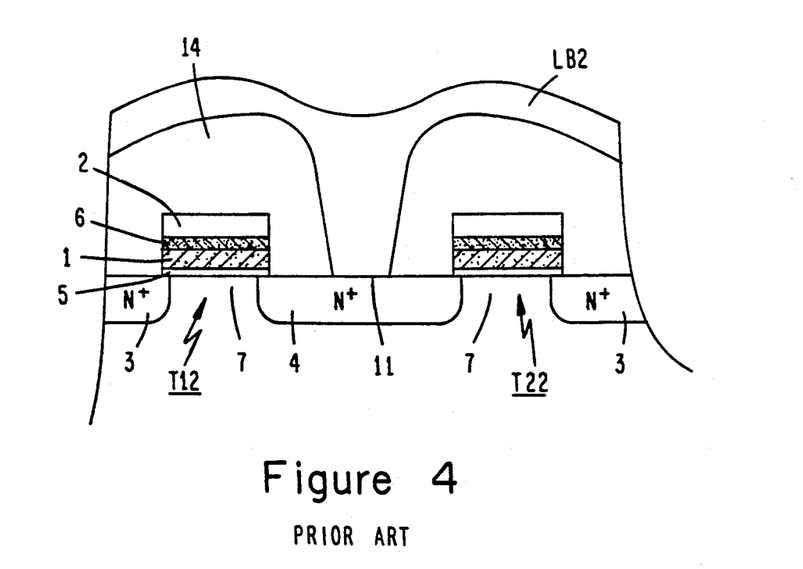
FIG. 4 is a section view according to line ZZ' of FIG. 2.

FIG. 4 is a section view according to the line ZZ' of FIG. 2 of the two transistors T12 and T22.

As shown on FIG. 1B, each transistor comprises a source region 3 and a drain region 4 separated by a channel region 7, together with superposed layers forming the gate oxide 5, the floating gate 1, the interpoly oxide 6 and the control gate 2.

The control gates of the transistors are covered by the isolation layer 14. The bit line LB2 is connected with the drains of the two transistors by the contact 11.

The above disclosed conventional architecture comprises elements which limit possible size reductions. On the one hand, there is a series of contacts between the bit lines and the drain areas every two transistor lines. On the other hand, FIG. 2 includes an isolation area 13, made of thick silicon oxide, between each common line pair 2 and each transistor column pair.

Also, one can see on FIG. 4, a step crossing of the bit line LB2 at its contact with the drain regions of transistors T12 and T22. All the bit lines, made for example of alumimum, must cross such steps at each pair of transistor rows, whereby the aluminum lines are liable to crack.

The invention provides an architecture for avoiding those drawbacks and presents the advantage of having a high coupling factor.

Figure 5A:
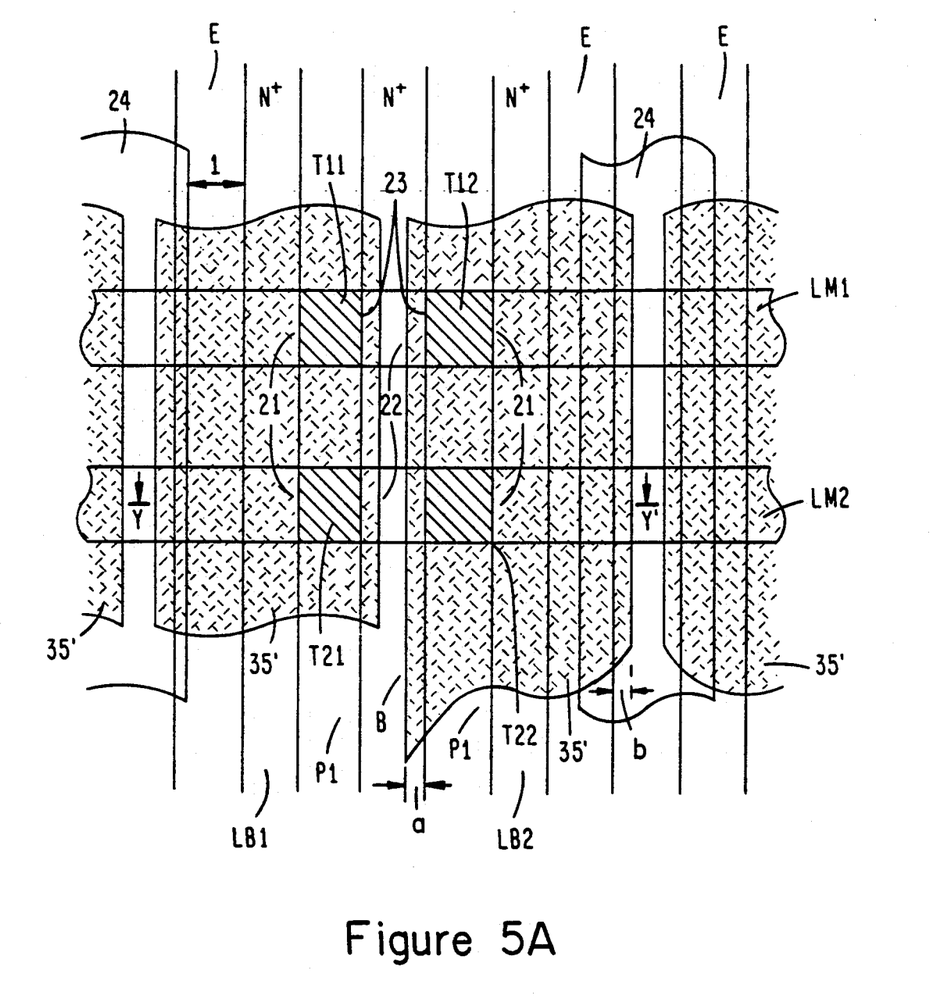
FIGS. 5A and 5B are top views of the design of four adjacent memory points on a silicon wafer according to the invention, at two different manufacturing steps.
Figure 5B:
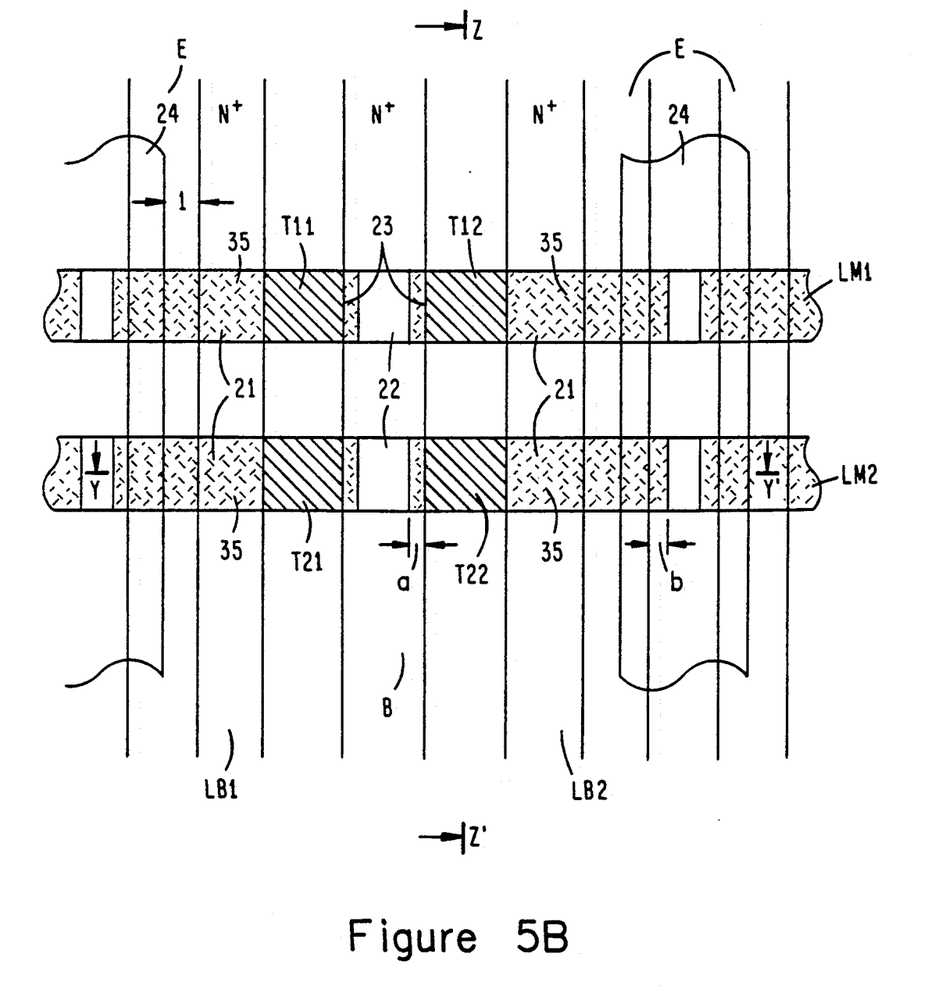

FIGS. 5A and 5B show this architecture as viewed from above. FIG. 5A shows the structure at an intermediate manufacturing step after deposition of two polysilicon levels. FIG. 5B shows the structure after deposition of a third polysilicon level and etching of the various polysilicon levels. The transistors are again arranged according to a row and column array, the transistors of the first row being again designated T11 and T12, the transistors of the second row by T21 and T22; Tij designates more generally a transistor at the intersection of row i and column j.

The control gates of the transistors of row i are again interconnected with a generally horizontally directed conductor called word line LMi. The word lines (polysilicon) extend in the row direction.

The bit lines LBj are made of substrate regions of a first conductivity type, for example N+. Each bit line constitutes directly a drain 21 at the position of each transistor. Therefore, it is no longer necessary to provide a contact at each pair of rows on each bit line (contacts 11 on FIG. 2).

Conductive constant-potential lines B having a generally vertical orientation are arranged between each pair of bit lines. Those constant-potential lines B correspond to regions of the first conductivity type, like the bit lines LBj, and constitute the sources 22 at the positions of the transistors.

On each side of the two bit lines, LB1 and LB2, shown on FIGS. 5A and 5B, which are arranged on both sides of the same constant-potential line B, are isolating areas 24, usually made of thick silicon oxide.

The floating gates 23 of the transistors correspond to a first polysilicon level (poly 1) and are arranged on both sides of each constant-potential line B.

Areas E, made from the first polysilicon level, cover the sides adjacent to the transistor columns of the isolating areas (24) and project therefrom according to a length 1. During the manufacturing step shown on FIG. 5A, floating gates 23 are still a portion of the poly 1 stripes designated by P1 which extend along a column direction. At the manufacturing step shown on FIG. 5B, the poly 1 stripes P1 are etched and the floating gates 23 are definitively formed by poly 1 rectangles.

On FIG. 5A, a layer 35' made from the second polysilicon level (poly 2) is connected to each poly 1 stripe P1 and extends along the column direction. The layers 35' have a larger width than that of the poly 1 stripes P1. On FIG. 5B. one will see the areas 35 made by the poly 2 and which correspond to the remaining portion of the layer 35' after etching of the latter. Each area 35 is connected to a floating gate 23. The size along the column direction of areas 35 is identical to that of the floating gates 23, and the size along the row direction of areas 35 is greater than that of the floating gates 23. Along the direction of the rows, the areas 35 extend away from the floating gates 23, near the source regions 22, according to a length a, and the areas 35 pass over the areas E and extend away from them according to a length b.

The word lines LM1 and LM2 are made by a third polysilicon level (poly 3).

Since the source and drain of a transistor are arranged according to an horizontal direction, the current in the channel flows in the horizontal direction, or word line direction, and thus, the transistor has a channel region arranged in the same direction as the word lines.

FIGS. 6A-6G are section views along lines YY' of FIGS. 5A or 5B, each of which corresponds to a manufacturing process step according to the invention carried out on a silicon substrate 20.

Figure 6A:
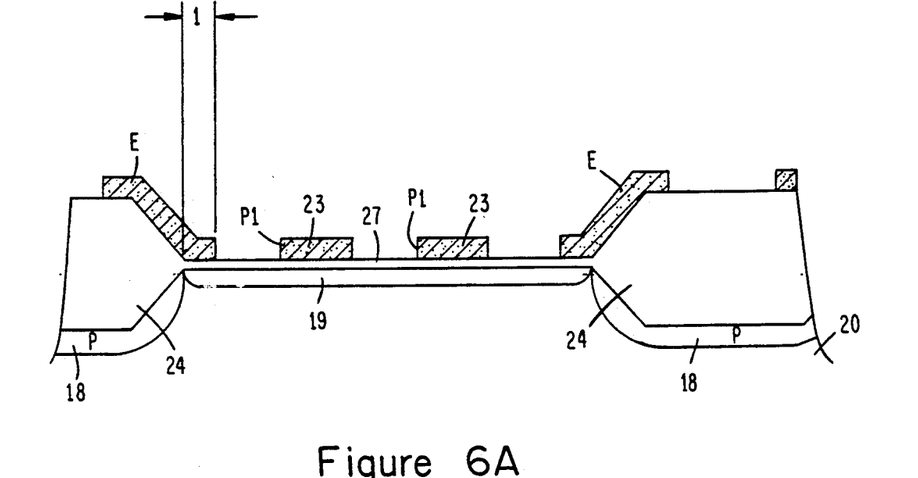
FIGS. 6A-6G are illustrations of successive manufacturing steps according to the invention.

In FIG. 6A is shown the structure at a preliminary step after formation of the thick oxide 24 and of the gate oxide layers 27, after deposition and etching of the first polysilicon level for forming, on the one hand, the poly 1 stripes P1 wherein will be subsequently located the transistor floating gates 23 and, on the other hand, the areas E. The thick oxide areas 24 have for example a thickness of 700 nm and the gate oxide layers 27 have for example a thickness of 20 nm. Conventionally, P-type regions 18 are arranged under the thick oxide areas 24. Those regions 18 are usually called channel-stop regions. Doped regions 19 arranged under the gate oxide layers 27 for determining the triggering threshold of the memory transistors are also shown.

For the sake of legibility of the drawings, regions 18 and 19 are not shown on FIGS. 6B-6G.

Figure 6B:
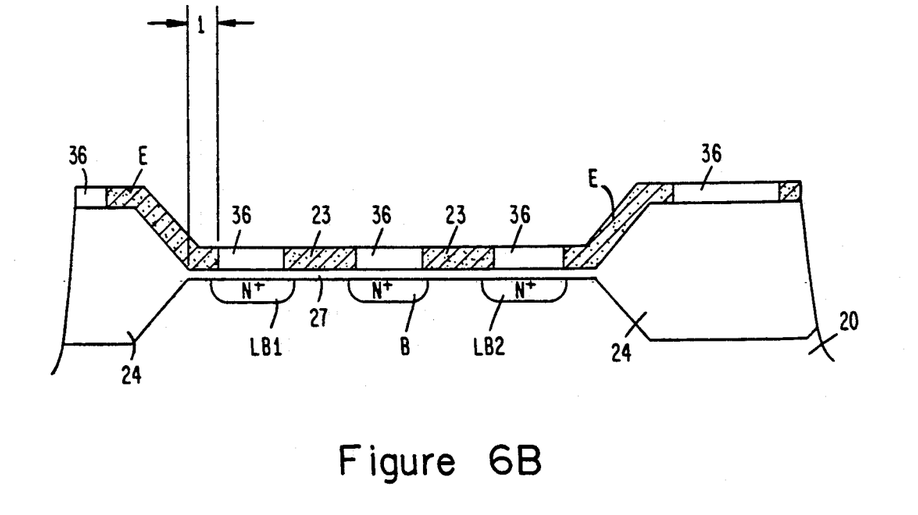

In FIG. 6B is shown the structure at an intermediate step after formation of highly doped N+-type regions which correspond, on the one hand, to the bit lines LBj and, on the other hand, to the constant-potential lines B. Those regions are obtained through arsenic implantation.

FIG. 6B also shows the structure after deposition of an isolating layer 36 between the various poly 1 areas. Conventionally, a planarization process is used for causing the upper surfaces of this layer 36 and the upper surfaces of the first polysilicon level to be at the same level. This layer 36 is made of silicon oxide obtained for example through CVD (chemical vapor disposition) from a TEOS source (tetraethyl ortho silicate).

Figure 6C:
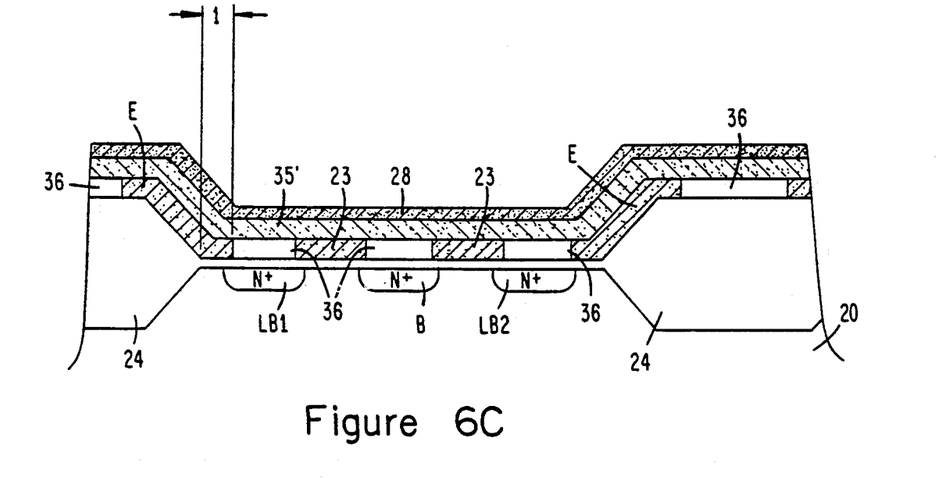

In FIG. 6C is shown the structure at an intermediate step after disposition of the second polysilicon level 35' and realization of an isolating layer 28, usualled called interpoly oxide layer, and which is made in this structure by piling up three layers: silicon oxide, silicon nitride, silicon oxide, called ONO.

Figure 6D:
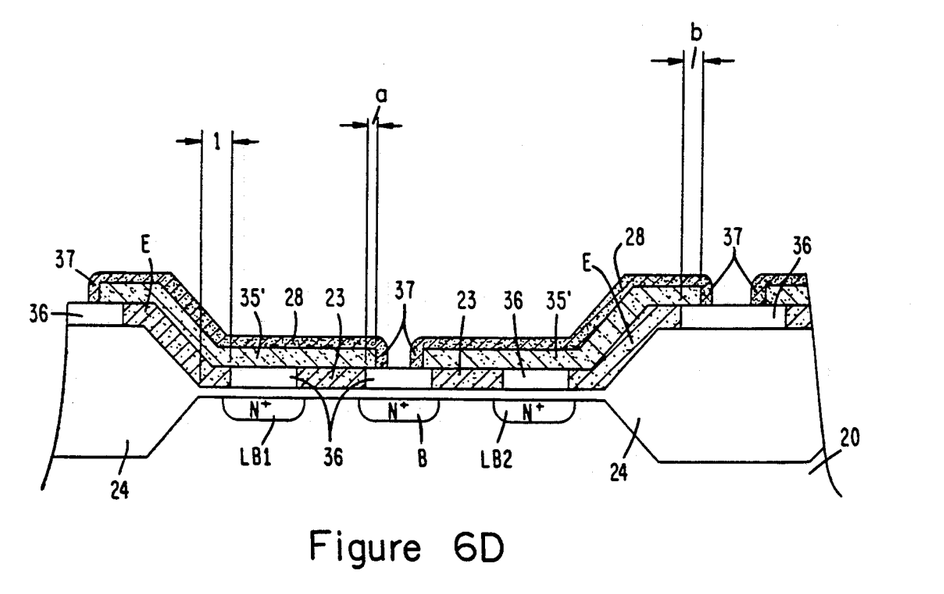

In FIG. 6D is shown the structure at an intermediate step after etching of the interpoly oxide layer 28 and of the second polysilicon level 35' at the level of a portion of the isolating layer 36 arranged at the position of the constant-potential lines B and, on the other hand, at the position of the isolation layer 36 arranged over the thick oxide areas 24.

In FIG. 6D is also shown the structure after formation of an oxide area 37, called corner oxide, at each end, along the row direction, of the layers 35' determined by etching.

Figure 6E:
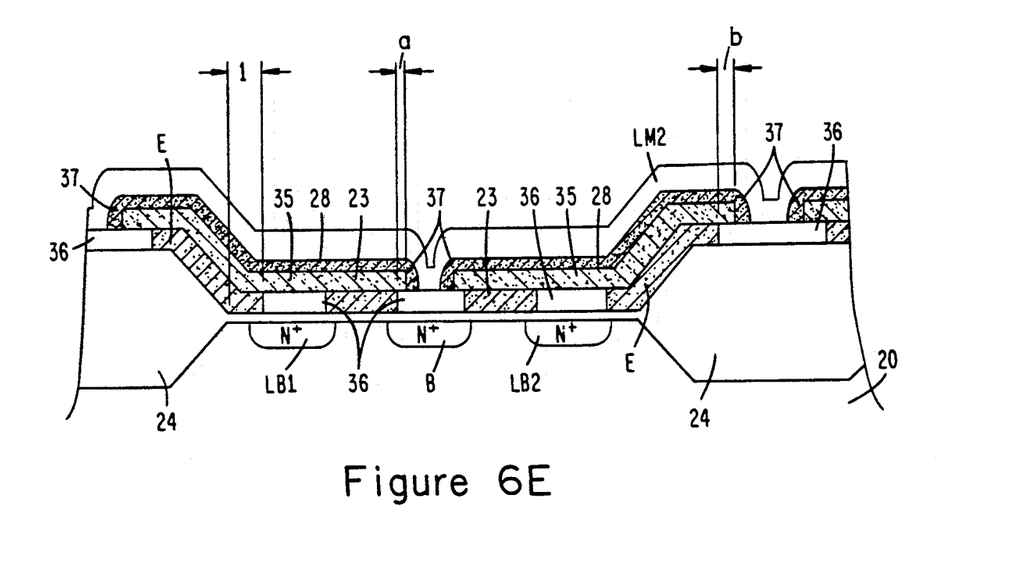

In FIG. 6E is shown the structure at an intermediate step after deposition of the third polysilicon level (poly 3) from which are formed the word lines, LMi, and etching of poly 3, of the ONO interpoly oxide layer 28, of poly 2 and poly 1, which establishes the word lines, LMi, formed in poly 3, the areas 35 formed in the layers 35', and the floating gates 23 formed in the poly 1 stripes P1.

Figure 7:
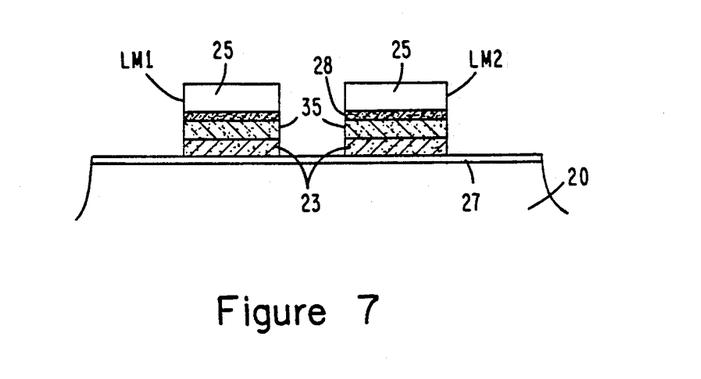
FIG. 7 is a section view according to line ZZ' of FIG. 5B.

The structure resulting from the etching of the various layers can also be seen on FIG. 7, which is a section view along line ZZ' of FIG. 5B.

It is also apparent from FIG. 6E that the ONO interpoly oxide layer 28 and the corner oxide areas 37 ensure the isolation between the word lines and areas 35.

Figure 6F:
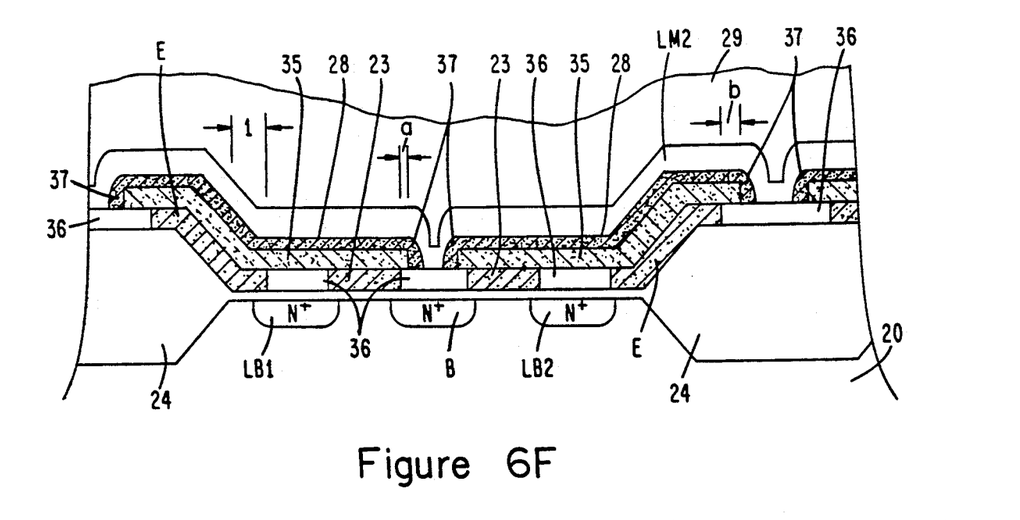

In FIG. 6F is shown the structure at an intermediate step after deposition of an isolating layer 29. This layer 29 is for example made of boron and phosphorus doped silicon oxide (BPSG).

Figure 6G:
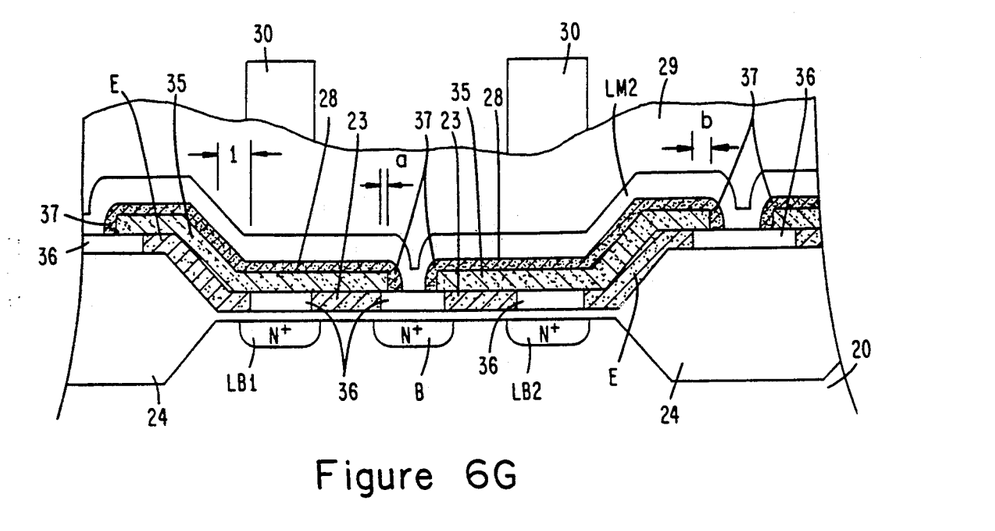

In FIG. 6G is shown the structure at the final step after realization of conductive lines 30 arranged on the isolating layer 29 and made for example of aluminum, each line being positioned above a bit line.

Conductive lines 30 are connected to bit lines of other memory blocks (in fact, the memory points are usually grouped according to blocks, each block comprising a given number of rows and columns), thus permitting the desired voltage to be applied to those bit lines and to the transistor drains to which the bit lines are connected.

The conductive lines 30 extend on a planar surface, which avoids the drawbacks inherent to step crossings to which the aluminum lines of the prior art are submitted.

Moreover, the interval between the pairs of conductive lines 30 is longer than the one existing between the pairs of aluminum lines constituting the bit lines in the conventional pattern.

On FIG. 7, which is a section view along line ZZ' of FIG. 5B, one will see the transistor floating gates 23, those floating gates being arranged over the gate oxide layer 27. One will also see the areas 35 formed by the second polysilicon level, and the ONO interpoly oxide layers 28 arranged above the areas 35. One will also note the two word lines, LM1 and LM2, corresponding to the control gates 25 at the position of the transistors.

Figure 8A:
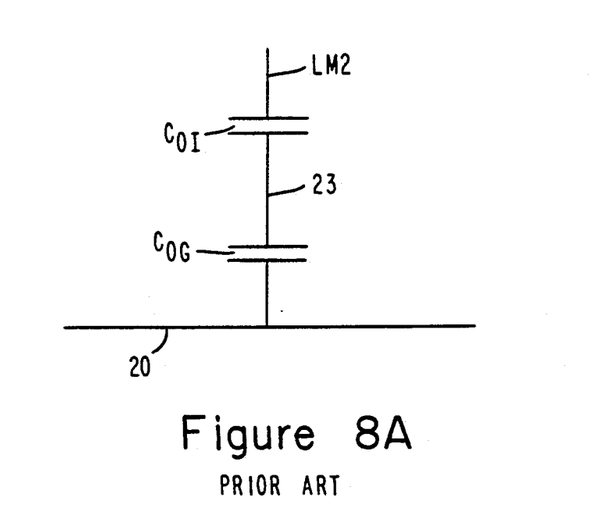
FIGS. 8A and 8B are diagrams of capacitors existing at the position of a transistor, according to two embodiments.
Figure 8B:
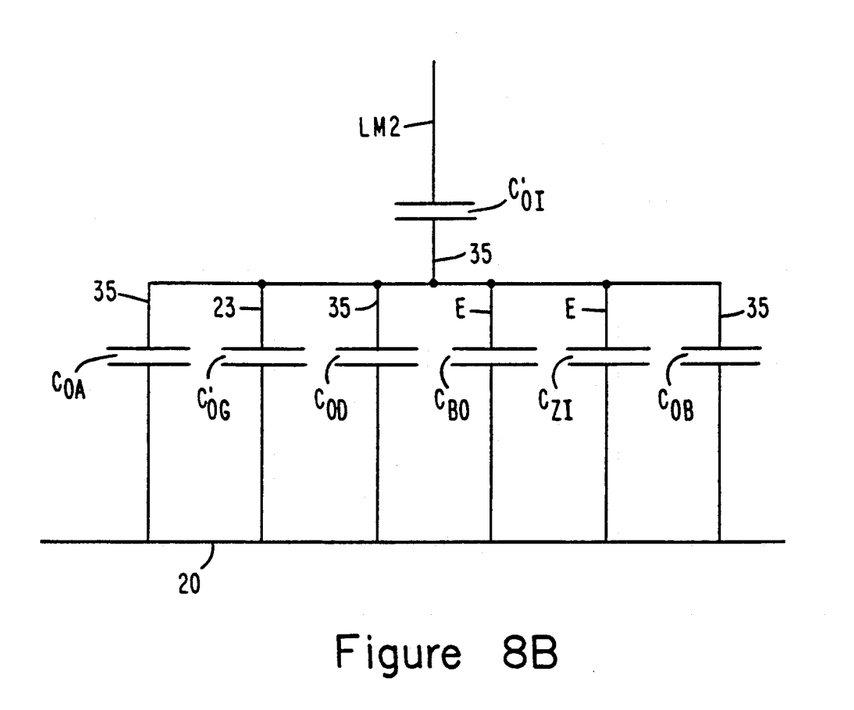

In FIG. 8A is shown the capacitors existing at the position of a transistor in case the architecture does not have an area 35 connected to the floating gate 23 of the transistor, and FIG. 8B shows the capacitors existing at the position of a transistor according to the invention.

In both cases, if a voltage $V_M$ is applied to the word line LM2, one obtains the voltage $V_F$ on the floating gate by calculating the coupling factor $\gamma$ which associates those two voltages according to the relation:

$$V_F = \gamma V_M$$

and which is determined by the ratio between the capacitor at the level of the interpoly oxide layer and the sum of all the capacitors.

Referring to FIG. 8A, one will note the capacitor $C_{OI}$ at the level of the interpoly oxide layer 28 between the word line LM2 and the floating gate 23. There is also a capacitor $C_{OG}$ at the level of the gate oxide layer 27 between the floating gate 23 and the substrate 20.

The coupling factor is defined by:

$$\gamma = C_{OI}/(C_{OI} + C_{OG}).$$

A value representative of the coupling factor can be calculated by using the usual values for the size of the elements:

length of the floating gate along the row direction: 0.8 micrometer, thickness of the interpoly oxide layer: 20 nm, thickness of the gate oxide layer: 20 nm.

The value of the coupling factor is then equal to the ratio between the quantities 0.8/20 and 0.8/20+0.8/20. That is, the coupling factor is equal to 0.5.

Referring to FIG. 8B, corresponding to the case wherein the area 35 is connected with the transistor floating gate, another capacitor $C'_{OI}$ appears at the level of the interpoly oxide layer 28 and is arranged between the word line LM2 and the area 35. There is also a capacitor $C'_{OG}$ at the level of the gate oxide layer 27. There are as well a capacitor $C_{OA}$ corresponding to the portion of area 35 which extends over the floating gate 23 through to a length a along the row direction, a capacitor $C_{OD}$ at the level of the TEOS-type oxide separating the floating gate 23 from area E, a capacitor $C_{BO}$ corresponding to the portion of area E which extends through to a length 1 over the isolation areas 24, at the level of the gate oxide layer 27 arranged between the portion of the extending area E and the substrate 20, a capacitor $C_{ZI}$ corresponding to the portion of area E arranged over the isolation area 24, superposed this isolation area 24, and a capacitor $C_{OB}$ corresponding to the extension of area 35 over area E according to a length b, superposed with (a) the portion of TEOS-type oxide separating two areas E and (b) the isolation area 24.

The coupling factor is defined by:

$$\gamma = C'_{OI}/(C'_{OI} + C_{OA} + C'_{OG} + C_{OD} + C_{BO} + C_{ZI} + C_{OB})$$

A value representative of the coupling factor can be calculated by using the usual following values:

extension of the area 35 over the floating gate along the row direction, designated by a: 0.2 micrometer, length of the floating gate along the row direction: 0.8 micrometer, length of the portion of the TEOS-type oxide which separates the floating gate 23 from area E: 0.8 micrometer, extension of the area 35 over the isolation area 24 along the row direction: 0.4 micrometer, length of area E along the row direction: 0.8 micrometer, extension of the area 35 over area E along the row direction, designated by b: 0.2 micrometer, thickness of the interpoly oxide layer: 20 nm, thickness of the gate oxide layer: 20 nm, thickness of the TEOS-type oxide: 200 nm, thickness of the isolation area: 700 nm.

The value of the coupling factor is then equal to the ratio between the quantities $(0.2+0.8+0.8+0.8+0.2)/20$ and $(0.2+0.8+0.8+0.8+0.2)/20+0.2/(200+20)+0.8/20+0.8/(200+20)+0.4/20)+0.4/700+0.2/(200+700)$. That is, the coupling factor is substantially equal to 0.70.

This architecture, owing to the presence of the area 35 connected to the transistor floating gate, thus provides a substantially improved coupling factor.

Figure 9:
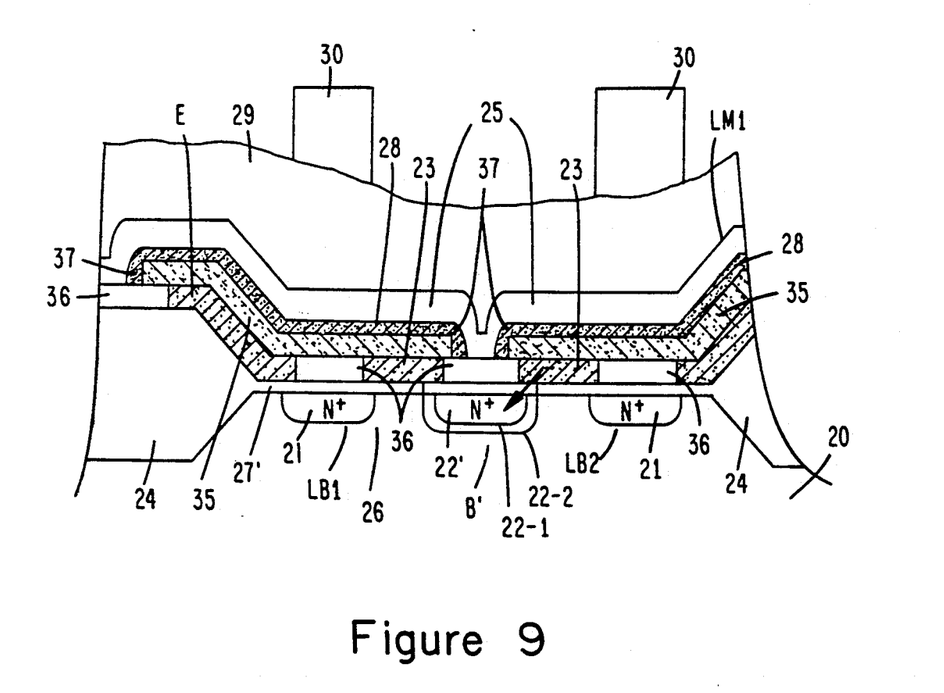
FIG. 9 is a sectional view an alternative embodiment of the invention.

In FIG. 9 is shown a variant of the invention. This figure, which is a section view analagous to FIG. 6G, comprises the various elements constituting the architecture according to the invention. The main elements are:

a floating gate 23 corresponding to a first polysilicon level at the position of each transistor;

two bit lines LB1 and LB2 which correspond to the drain 21 at the position of the transistors;

two insulating areas 24 made of thick silicon oxide;

a word line LM1 made of a third polysilicon level, corresponding to the control gate 25 at the position of the transistors;

a constant-potential line B' which has a different structure with respect to the corresponding line of FIG. 6G.

According to the invention, the gate oxide layer 27' of FIG. 9 is very thin with respect to the usual values; its thickness is for example about 10 nm.

The constant-potential line B' is made of two portions doped at various concentrations. A first portion 22-1 is highly doped, for example N+; this first portion is arranged in a pocket 22-2 of the same conductivity type but with a low doping level, N−.

The constant-potential line B' corresponds to the sources 22' at the positions of the transistors.

If a sufficiently high voltage is applied to the source 22' this new arrangement permits to transfer (through a tunnel effect) charge carriers trapped during a writing operation in the transistor floating gate from the floating gate to the highly doped source portion. This transfer is possible due to the very small thickness of the gate oxide layer; it is represented by an arrow on FIG. 9. The presence of the second low doped portion permits to increase the breakdown voltage between source and substrate.

However, the contact regions between a thin oxide layer and a thick oxide area form defects which impair the transfer of the charge carriers, and such contact regions can be seen in the conventional structures of programmable non-volatile and electrically erasable memories, or EEPROM, according to a so-called "FLOTOX" technology.

The advantage of the architecture according to the invention lies in the fact that the thin oxide areas where the charge carriers move are never in contact with or close to a thick oxide layer.

Therefore, it is possible to manufacture EPROM flash memories, that are electrically erasable through a suitable voltage applied to the transistor sources.

I claim:

1. A memory array comprising plural floating gate transistors each including a source, drain, control gate and floating gate;

word lines (LM1, LM2) extending along a first direction, called row direction, interconnecting the control gates (25) of the floating gate transistors;

bit lines (LB1, LB2) extending along a second direction, called column direction, interconnecting the drains of the floating gate transistors;

a constant-potential line (B) extending along a column and formed by diffusion of a first conductivity type interconnecting the sources of the floating gate transistors, the constant-potential line being arranged between each pair of bit lines, all the constant-potential lines being at the same potential;

an isolation area (24) extending along a column arranged on a side of each bit line opposite to one of the constant-potential lines;

a conductive pad (E) covering longitudinal sides of the isolation areas (24), said pad (E) being made of the same material as the material forming the floating gates (23) of the floating gate transistors;

a conductive area (35) connecting the floating gate (23) of each transistor to the corresponding pad, the conductive area being superposed with the corresponding word line from which it is separated by an isolation layer (28).

2. The memory of claim 1 wherein said conductive area (35) in each of said transistors has:

a width in the column direction substantially equal to the width of the word line and the floating gate in the particular transistor, said conductive area in each of said transistors extending along the row direction on both sides of the floating gate of the particular transistor, the conductive area in each of said transistors extending away by a first length (a) from the floating gate of the particular transistor on the side of the constant-potential line, the conductive area in each of said transistors extending onto the isolation area (24) of the particular transistor and onto the pad (E) adjacent the transistor and further extending beyond said pad (E) by a second length (b).

3. The memory of claim 2 wherein the floating gates (23), the conductive areas (35) and the word lines (LMi) are formed from first, second and third polysilicon levels, respectively.

4. The memory of claim 3 wherein the isolation areas (24) are made of a thick silicon oxide corresponding to a field oxide.

5. The memory of claim 1 wherein the conductive area is shaped as a rectangle having a length greater than the length of the floating gate along the row direction.

* * * * *